United States Patent [19]

Koyama et al.

[11] Patent Number: 4,498,022
[45] Date of Patent: Feb. 5, 1985

[54] TRISTATE OUTPUT BUFFER WITH HIGH-IMPEDANCE STATE RESPONSIVE TO INCREASE IN POWER SUPPLY VOLTAGE

[75] Inventors: Kazumi Koyama, Takarazuka; Toshitaka Fukushima; Yuichi Kawabata, both of Yokohama, all of Japan

[73] Assignee: Fujitsu Limited, Kawasaki, Japan

[21] Appl. No.: 329,925

[22] Filed: Dec. 11, 1981

[30] Foreign Application Priority Data

Dec. 25, 1980 [JP] Japan .................................. 55-184562

[51] Int. Cl.³ .................. H03K 3/013; H03K 19/088; H03K 19/092
[52] U.S. Cl. .................................. 307/473; 307/363; 307/443; 307/566
[58] Field of Search ................................. 307/473–475, 307/442, 443, 363, 566; 365/168, 226

[56] References Cited

U.S. PATENT DOCUMENTS

| | | | |
|---|---|---|---|
| 4,044,330 | 8/1977 | Johnson et al. | 307/473 X |
| 4,194,132 | 3/1980 | Mrazek | 307/270 X |
| 4,321,489 | 3/1982 | Higuchi et al. | 365/226 X |
| 4,339,675 | 7/1982 | Ramsey | 307/473 |
| 4,380,709 | 4/1983 | Au | 307/473 |
| 4,425,517 | 1/1984 | Smith | 307/473 |

Primary Examiner—Stanley D. Miller
Assistant Examiner—David R. Hudspeth
Attorney, Agent, or Firm—Staas & Halsey

[57] ABSTRACT

An output buffer circuit capable of three-output states of high and low levels and a high impedance. The output buffer circuit includes a detector circuit for detecting that a power source voltage for the buffer circuit is particularly high and for turning the output of the buffer circuit to the high impedance state when the high voltage is detected.

19 Claims, 9 Drawing Figures

TRISTATE OUTPUT BUFFER WITH HIGH-IMPEDANCE STATE RESPONSIVE TO INCREASE IN POWER SUPPLY VOLTAGE

BACKGROUND OF INVENTION (1) Field of the Invention

The present invention relates to an output buffer circuit having three-output states including a high level, a low level and a high impedance.

(2) Description of the Prior Art

The prior art will be explained by referring to the following drawings: FIG. 1 designates a block diagram illustrating a conventional bipolar 4K-bit Programmable Read-Only Memory PROM device; FIG. 2 is a partial and detailed circuit diagram of the PROM of FIG. 1; FIG. 3 is a circuit diagram which is equivalent to a transistor cell used in the memory cell array in FIGS. 1 and 2; and FIG. 4 is a circuit diagram showing an output buffer employed in the PROM shown in FIGS. 1 and 2.

As shown in FIG. 1, the conventional bipolar 4K-bit PROM device comprises a memory cell array 2 composed of 4096 memory cells disposed in a matrix of 64 rows and 64 columns. Each of the memory cells is composed, for example, of an open-base type transistor which is equivalent to a series connection of two diodes of opposite polarities. The writing-in of information into one of the memory cells is effected by forcing one of the PN junctions into a short-circuit status with a large writing-in current. A word address buffer or word address inverters 4 amplify and invert input word address signals $A_0$ through $A_5$, and word address decoder/driver 6 decodes the word address signals from the word address buffer 4 and applies the decoded word address signals to the memory cell array 2. Bit address buffer or bit address inverters 8 amplify and invert input bit address signals $A_6$ through $A_9$, and apply the output bit address signals to bit address decoder 10 connected to multiplexer 14 and bit address decoder 12 connected to program circuit 20. The decoder 10 decodes the output bit address signals from the bit address buffer 8 and applies the decoded bit address signals (bit selection signals for reading-out) to the multiplexer 14. The multiplexer 14 reads out information from the memory cells connected between the word line selected by the above-mentioned word address decoder/driver 6 and the bit lines selected by the bit address decoder 10. The output buffer 16 amplifies the read-out signals from the multiplexer 14, and applies the amplified read-out signals to output terminals $OP_1$ through $OP_4$. The output buffer 16 is enabled by chip enable circuit 18 which receives an input chip enable signal. The decoder 12 decodes the output bit address signals from the bit address buffer 8 and applies the decoded bit address signals (bit address signals for writing-in) to the program circuit 20. The program circuit 20 writes into information to the memory cells which are connected between the word line selected by the word address decoder/driver 6 and the bit lines selected by the bit address decoder 12.

The reading out of information from the above-mentioned PROM is effected by applying the 6 single bit word address signals $A_0$ through $A_5$ to the word address buffer 4, the 4 single bit address signals $A_6$ through $A_9$ to the bit address buffer 8, and a low level signal to the chip enable circuit 18. The 4 bits of information from the selected memory cells appear at the output terminals $OP_1$ through $OP_4$, via the multiplexer 14 and the output buffer 16.

The writing-in of information to the PROM is effected by applying the word address signals $A_0$ through $A_5$ to the word address buffer 4, the bit address signals $A_6$ through $A_9$ to the bit address buffer 8, and a high level signal to the chip enable circuit 18. The 4 bit of data to be written-in applied to the output terminals $OP_1$ through $OP_4$ of the PROM device. In this case, the output buffer 16 is cut off from the output terminals $OP_1$ through $OP_4$ because of the high level signal applied to the chip enable circuit 18. Therefore, the data signals to be written-in pass from the output terminal to the program circuit 20, and the writing-in of information corresponding to the data signals into the selected memory cells is effected.

The writing-in operation will be described more in detail. As shown in FIG. 2, for example, the PROM comprises memory cells $C_{00}$, $C_{01}$, - - - , each consisting of a bipolar transistor whose base is shown not connected and being connected to each of the points at which word lines $W_0$, $W_1$, - - - cross bit lines $B_0$, $B_1$, - - -, respectively. Writing into the PROM is carried out as follows: a large writing-in current of about 120mA is applied to a terminal which serves as a read output terminal and as a program (or write) terminal; one of the bit lines e.g. bit line $B_0$ is selected by the program circuit 20 and to the bit line selected is applied the writing-in current; one of word lines e.g. word line $W_1$ is selected by the word address decoder/driver 6 and the word line selected is made the low level; and the writing-in current is applied to the cell $C_{10}$. When writing is carried out as described above, the base-emitter connection of cell $C_{10}$ is broken down to short-circuit state and only the base-collector connection thereof becomes equivalent to a forward direction or bias diode. In the case of cells to which such writing is not applied, the base-emitter connection of each of them serves as a reverse polarity or bias diode in the circuit and current is therefore not allowed to flow even if a read voltage (Vcc) of about 5 V is applied between the bit and word lines. In the case of cells to which writing-in current is applied, read-out current is allowed to flow. Responsive to such an ON and OFF of the read-out current, information "1" and "0" is provided as output data.

With respect to the write transistor cell $C_{10}$, the write transistor can be designated by a series connection of two diodes $D_{CB}$ and $D_{BE}$ as shown in FIG. 3. The respective anodes of the diodes $D_{CB}$ and $D_{BE}$ are connected together and to correspond to the base of the write transistor. The cathode of the diode $D_{CB}$ corresponds to the collector thereof and the cathode of the diode $D_{BE}$ corresponds to the emitter thereof. In order for the write operation to be carried out in the PROM, the diode $D_{BE}$ is caused to break down and to be short circuited.

Reading out is carried out as follows: read voltage ($V_{CC}$) is applied to a bit line selected by the multiplexer 14; a word line is grounded by the word address decoder/driver 6 through a transistor Q; and potential appearing at the bit line is applied through the multiplexer 14 to an output buffer 16. This potential appearing at the bit line becomes the high level when no writing-in current is applied to the cell and of low level when writing-in current has been applied to the cell. These levels serve as read outputs.

The output buffer 16 is an amplifier which generates the read output responsive to the potential appearing at the bit line at the time of reading out. The output section of output buffer 16 is of a three-state type that does not cause any trouble by interrupting the high writing-in current which is applied to its output terminal at the time of programming or writing-in. As shown in FIG. 4, this output buffer 16 comprises an input stage transistor $Q_1$, a phase splitting transistor $Q_2$, output stage transistors $Q_3$ and $Q_4$, resistors $R_1$-$R_4$, and a diode D, and the output stage is of a three-output type like a totem pole. In place of the transistor $Q_3$ and the diode D, a darlington pair of transistors may also be used. Ti represents an input terminal connected to the multiplexer 14. If the potential appearing at the bit line is the low level, current is not allowed to flow to the collector side but is allowed to flow on the emitter side of transistor $Q_1$, so that the transistor $Q_2$ is turned OFF. Transistor $Q_3$ is turned ON while the transistor $Q_4$ is turned OFF and output terminal $T_0$ is made high. However, if the potential appearing at the bit line is the high level, current is allowed to flow to the collector side of transistor $Q_1$, so that the transistor $Q_2$ is turned ON, while transistor $Q_3$ is turned OFF, transistor $Q_4$ is turned ON and output terminal $T_0$ is made low. When output of inverter I is made low, the base and collector of transistor $Q_2$ become the low level through diodes $D_1$ and $D_2$, so that transistors $Q_2$, $Q_3$ and $Q_4$ are turned OFF and the output terminal $T_0$ is turned to the high impedance state. In FIG. 4, the diodes $D_1$ and $D_2$ may be replaced by PNP-transistors whose bases are connected to the output of the inverter I, collectors are connected to the base and collector of the phase splitting transistor $Q_2$ and emitters are connected to the ground. Even if a writing-in current is applied to the terminal $T_0$ which has been turned to such a high impedance state, the high voltage is not clamped by the output stage elements of output buffer 16 to ground or the Vcc level.

In order to put the output buffer in the impedance state, it is necessary that signal S be applied to the input terminal of inverter I to cause the output of the inverter to be the low level. In addition, when the writing mode is changed to the reading mode, it is necessary that signal S be changed to make inverter I output the high level.

Further, even in this three-output-state circuit, both of output stage transistors $Q_3$ and $Q_4$ are turned ON which wastes a large amount of current, thus causing output stage transistors to breakdown. When the amplitude of input signal e.g. the potential appearing at the bit line is made small intending to achieve a high speed operation and at the same time the power source voltage (Vcc) changes to a higher level, for example, the input stage transistor $Q_1$ allows current to flow to both the emitter and collector sides thereof, so that the phase splitting transistor $Q_2$ is incompletely turned ON and as a consequence both of transistors $Q_3$ and $Q_4$ are turned ON, thus causing output stage transistors to be broken more easily.

SUMMARY OF THE INVENTION

The object of the present invention is to eliminate the above-mentioned drawbacks and to avoid the breakdown of the transistors in an output stage of an output buffer when a power source voltage Vcc becomes particularly high, by adding to the output buffer a circuit for detecting the change of potential of the power source voltage Vcc, that is, the state in which the power source voltage Vcc becomes particularly high, to make the output state of the output buffer be in high impedance state.

When provided with such a circuit, the output buffer can be automatically made a high impedance by the power source voltage Vcc at the time when a writing current is applied to the PROM. Namely, as shown in FIG. 2, the circuit which connects word lines to ground level at the time of writing comprises a transistor Q, a resistor R for supplying base current to the transistor Q, and the like. It is required, at the time of writing, that a large amount of base current be supplied to the transistor Q because a large amount of current must flow, while it is required at the time of reading that the base current must be limited in amount because the transistor Q functions as a signal control transistor. In order to achieve such adjustment, the voltage of the power source Vcc connected to the resistor R is changed from 5 V at the time of reading to 7 V, for example, at the time of writing (the Vcc supplied from the outside is changed from the outside). Vcc is certainly common to all circuits arranged on the PROM chip and the power source voltage Vcc for the output buffer 16 changes from 5 V to 7 V accordingly. When provided with a power source voltage responding circuit, the output buffer 16 can therefore automatically be made the high impedance by the writing operation change of the voltage. In the case where the power source voltage Vcc is increased by some unplanned cause while the output buffer is under operation, the output of output buffer also becomes the high impedance, thus preventing both of the output stage transistors $Q_3$ and $Q_4$ from becoming conductive simultaneously, as already stated.

DETAILED DESCRIPTION OF THE PREFERRED EMBODIMENTS

Figure 1:
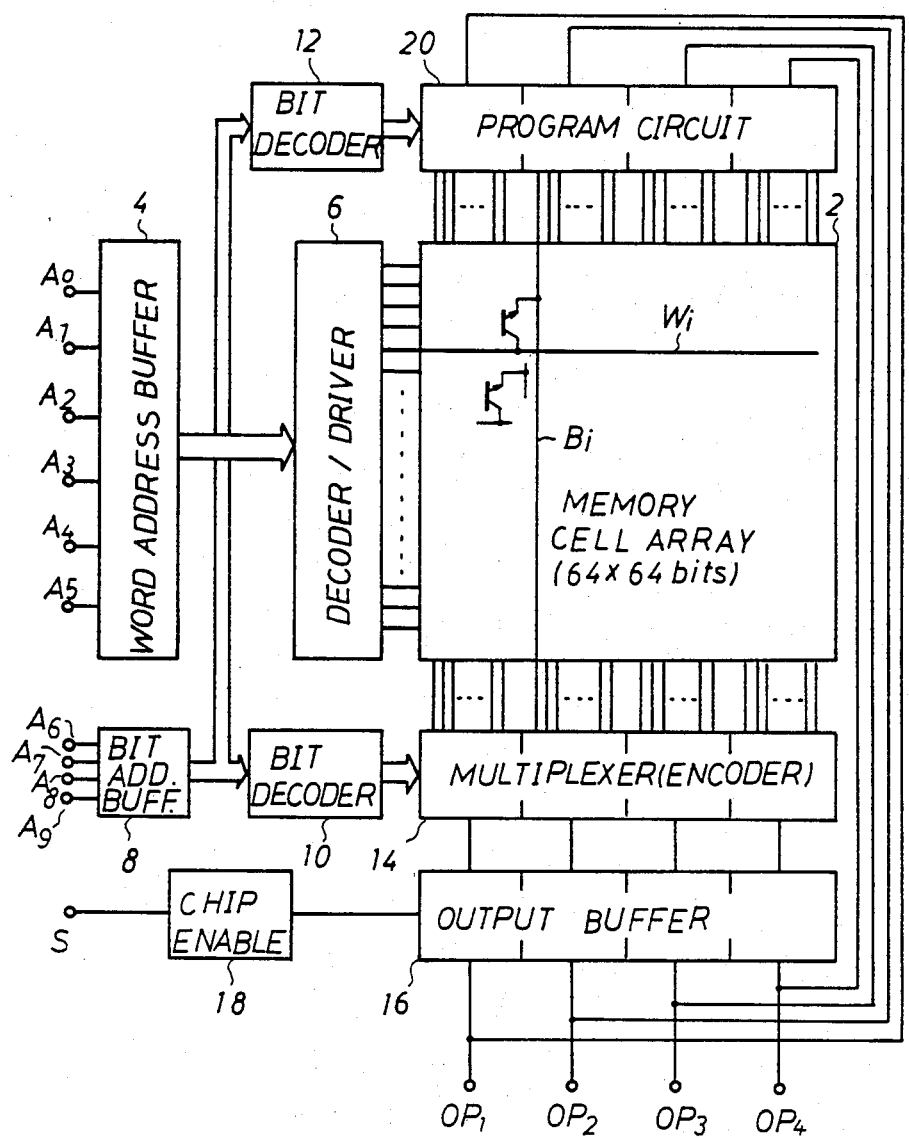
FIG. 1 is a block diagram illustrating a conventional bipolar 4K-bit PROM device.
Figure 2:
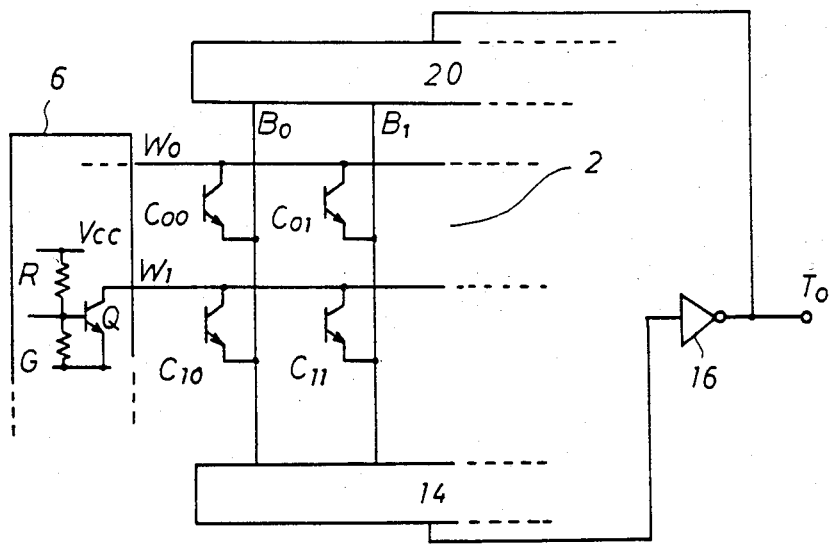
FIG. 2 is a partial detailed circuit diagram of the PROM of FIG. 1.
Figure 3:
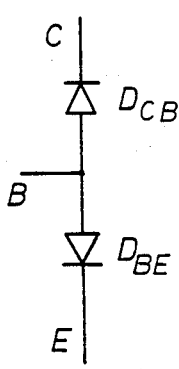
FIG. 3 is a circuit diagram which is equivalent to a transistor cell used in the memory cell array in FIGS. 1 and 2.
Figure 4:
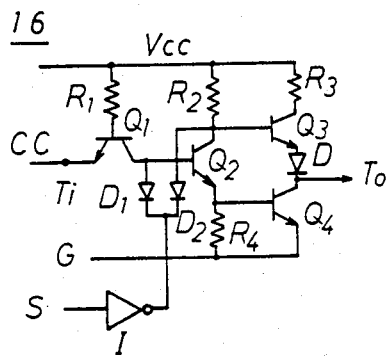
FIG. 4 is a circuit diagram of an output buffer employed in the PROM shown in FIGS. 1 and 2.
Figure 5:
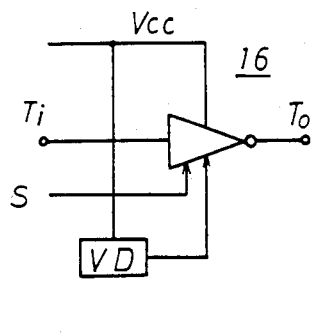
FIG. 5 is a block diagram illustrating the present invention.
Figure 6:
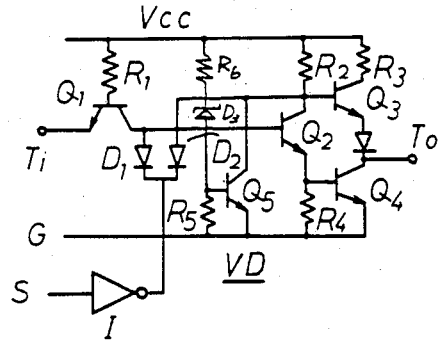
FIG. 6 is a circuit diagram of an embodiment of the present invention.

The output buffer 16 is basically an inverter and therefore can be represented by the symbol for an inverter as illustrated in FIG. 5. VD represents a circuit for detecting the change of a power source voltage and comprises a Zener diode $D_3$, resistors $R_5$ and $R_6$ and a transistor $Q_5$, as shown in FIG. 6. When the power source voltage Vcc rises in this circuit, the Zener diode $D_3$ is turned ON, so that the transistor $Q_5$ is turned ON to connect the collector of transistor $Q_2$ to ground G and to turn transistors $Q_2$, $Q_3$ and $Q_4$ OFF. The entire of circuit will be further described. If the input terminal Ti is at a high level when the power source Vcc is 5 V, which is the voltage at the time of reading, transistors $Q_2$ and $Q_4$ are turned ON while the transistor $Q_3$ is turned OFF and an output of the low level is applied to the terminal $T_0$. If the input terminal $T_i$ is at the low level, transistors $Q_2$ and $Q_4$ are turned OFF while the transistor $Q_3$ is turned ON and the output of the high level is applied to the terminal $T_0$. If input of inverter I is at the high level at this time, the output of this inverter I becomes of the low level, so that bases of transistors $Q_2$ and $Q_3$ become the low level, thereby turning transistors $Q_2$, $Q_3$ and $Q_4$ OFF. Namely, the output $T_0$ is turned to the high impedance-state. When the power source voltage is at a writing voltage state, that is, 7 V, the detector circuit detects the change of the power source voltage, thus causing the transistor $Q_5$ to be turned ON to connect the base of transistor $Q_3$ and the collector of transistor $Q_2$ to the ground. As a result, transistors $Q_2$, $Q_3$ and $Q_4$ are turned OFF changing the output terminal $T_0$ into high impedance state. In this situation, the output level of inverter I becomes the high impedance independent of whether it is high or low. Table I shows the relationship between the level of the input terminal $T_i$, the level of input S of the inverter I, the power source voltage $V_{cc}$ and output level of terminal $T_0$.

TABLE I

| Ti | S | Vcc | T0 |
|---|---|---|---|
| H level | L level | 5V | L level |
| L level | L level | 5V | H level |
| H level | H level | 5V | High Z |
| L level | H level | 5V | High Z |
| H level | L level | 7V | High Z |
| L level | L level | 7V | High Z |
| H level | H level | 7V | High Z |
| L level | H level | 7V | High Z |

As is apparent from Table I, the terminal $T_0$ becomes the low level when the power source voltage $V_{cc}$ is 5 V, the inverter input S is at the low level and the input terminal $T_i$ is at the high level. It becomes the high level when the power source voltage $V_{cc}$ is 5 V, the inverter input S is at the low level and the input terminal $T_i$ is at the low level. However, it always becomes the high impedance state under the other conditions. The transistor $Q_5$ may be of such a type as to connect the output terminal of the inverter I to the ground G unless the inverter I is broken even if the output of the inverter I is normally connected to the ground G. The inverter I may be omitted in a case where the terminal $T_0$ is turned to the high impedance state only at the time of writing.

Figure 7A:
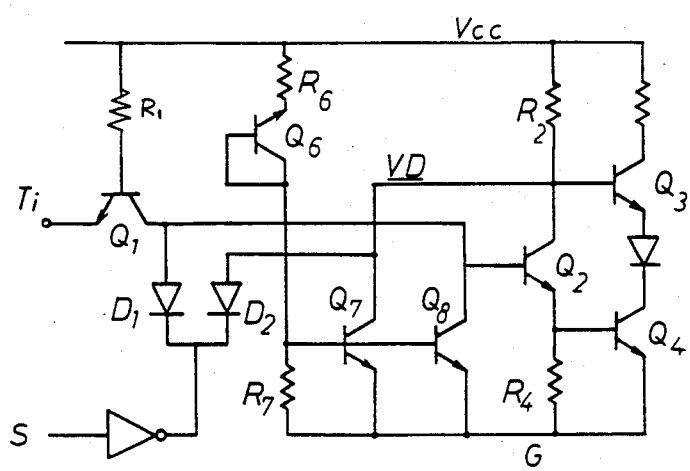
FIG. 7A is a circuit diagram of another embodiment of the present invention.
Figure 7B:
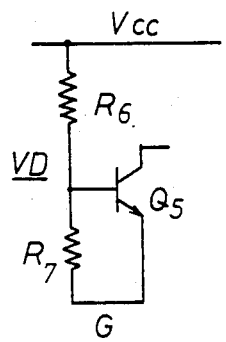
FIGS. 7B and 7C are partial circuit diagrams showing variations of the present invention.
Figure 7C:
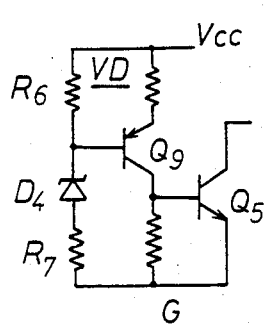

FIGS. 7A to 7C show various variations of the output buffer according to the present invention. The detector circuit for detecting the change of the power source voltage shown in FIG. 7A comprises transistors $Q_6$-$Q_8$ and resistors $R_6$ and $R_7$. When the power source voltage $V_{cc}$ rises, the emitter-base connection of transistor $Q_6$ is broken down and a base current is supplied to transistors $Q_7$ and $Q_8$, which are turned ON to connect the base and collector of transistor $Q_2$ to the ground. In FIG. 7B, the power source voltage $V_{cc}$ is divided by resistors $R_6$ and $R_7$ and applied to the base of transistor $Q_5$, and when the voltage $V_{cc}$ rises, the voltage divided by resistors $R_6$ and $R_7$ also rises, thereby turning the transistor $Q_5$ ON. In FIG. 7C, an amplifying transistor $Q_9$ is interposed between the detector circuit for the voltage $V_{cc}$ comprising resistors $R_6$ and $R_7$ Zener diode $D_4$, and the transistor $Q_5$. The Zener diode $D_4$ may be omitted. The collector of the transistor $Q_5$ of FIGS. 7B and 7C is connected to the base of the transistor $Q_3$ in FIG. 6.

According to the present invention as described above, an output buffer 16 capable of three-output states is provided with a circuit for making the output state of the buffer the high impedance state in correspondence to the rise of the power source voltage. Therefore, output stage transistors can be protected and the output buffer can be immediately turned to the high impedance-state by increasing the power source voltage at the time of writing in the case where the present invention is applied to a PROM or field programmable device.

We claim:

1. An output buffer circuit operative upon the supply of a power source voltage and capable of three-output states including a high level, a low level and a high impedance, the high and low levels being produced in response to an input signal, comprising:
    output means, operatively connected to receive the power source voltage and to a ground terminal, for generating the three output states where only one is generated at a time; and
    a detector circuit, operatively connected to receive the power source voltage, for detecting a rise in the power source voltage and forcing said output means to generate the high impedance output state irrespective of the input signal when the rise in the power source voltage is detected.

2. An output buffer circuit according to claim 1, wherein said output means comprises:
    a phase splitting transistor having a base operatively connected to receive the input signal, and having a collector and emitter; and
    first and second output stage transistors connected in series and each having a collector, emitter and base, the collector of said phase splitting transistor and the collector of said first output stage transistor are coupled to receive the power source voltage, the emitter of said phase splitting transistor is operatively connected to the base of said second output stage transistor, the collector of said phase splitting transistor is operatively connected to the base of said first output stage transistor, the emitter of said first output stage transistor is operatively connected to the collector of said second output stage transistor, and the emitter of said second output stage transistor is operatively connected to the ground terminal.

3. An output buffer circuit according to claim 2, wherein said detector circuit has an output connected to the collector of said phase splitting transistor.

4. An output buffer circuit according to claim 2, wherein said detector circuit comprises:
    a Zener diode having a cathode and an anode;
    a first resistor operatively connected to receive the power source voltage;
    a second resistor operatively connected to the ground terminal; and
    a detector transistor having a base, collector and emitter, the cathode of said Zener diode is operatively connected to said first resistor and the anode of said Zener diode is operatively connected to the base of said detector transistor and to said second resistor, the collector of said detector transistor is operatively connected to the collector of said phase splitting transistor, and the emitter of said detector transistor is operatively connected to the ground terminal.

5. An output buffer circuit according to claim 2, wherein said phase splitting transistor has a base, and wherein said detector circuit comprises:
  a first transistor having an emitter operatively connected to receive the power source voltage, a base and a collector operatively connected to the base;
  second and third transistors each having a base and collector and each having an emitter operatively connected to the ground terminal;
  a first resistor having a first end operatively connected to the power voltage source and having a second end; and
  a second resistor having a first end operatively connected to the ground terminal and having a second end, the second end of said first resistor is connected to the emitter of said first transistor, and to the collector of said first transistor is operatively connected the second end of said second resistor, and the bases of said second and third transistors, the collectors of said second transistor and said third transistor are operatively connected to the collector and the base of said phase splitting transistor, respectively.

6. An output buffer circuit according to claim 2, wherein said detector circuit comprises:
  a first resistor having a first end operatively connected to receive the power voltage source and having a second end;
  a second resistor having a first end operatively connected to the ground terminal and having a second end; and
  a detector transistor having an emitter operatively connected to the ground terminal and having a base and collector, and the second ends of said first and second resistors are operatively connected to the base of said detector transistor, the collector of said detector transistor is operatively connected to the collector of said phase splitting transistor.

7. An output buffer circuit according to claim 2, wherein said detector circuit comprises:
  first and second resistors each having a first end operatively connected to receive the power source voltage and having a second end;
  third and fourth resistors each having a first end operatively connected to the ground terminal and having a second end;
  a Zener diode having a cathode and an anode;
  a first transistor having a base, an emitter and a collector; and
  a second transistor having an emitter operatively connected to the ground terminal and having a base and collector, the second end of said first resistor, the cathode of said Zener diode and the base of said first transistor are operatively connected to one another, the anode of said Zener diode is connected to the second end of said third resistor, the second end of said second resistor is operatively connected to the emitter of said first transistor, and the collector of said first transistor, the base of said second transistor and the second end of said fourth resistor are operatively connected to one another, and the collector of said second transistor is operatively connected to the collector of said phase splitting transistor.

8. An output buffer circuit operatively connectable to receive an input signal and a control signal, capable of three-output states including high and low levels and high impedance, and having a power source voltage terminal and an output, comprising:
  a detector circuit, operatively connected to the power source voltage terminal and the output, for detecting a rise of the power source voltage for said buffer circuit, for turning the output of said output buffer circuit to the high impedance state and for producing the high and low levels in dependence upon the input signal; and
  a control circuit, operatively connected to the detector circuit and operatively connectable to receive the control signal, for turning the output of said output buffer circuit to the high impedance state responsive to the control signal applied thereto.

9. An output buffer circuit according to claim 8, wherein said detector circuit further comprising a phase splitting transistor having a base coupled to receive said input signal, an emitter coupled to ground and a collector, and wherein said control circuit comprises:
  an inverter having an input coupled to receive said control signal and having an output; and
  first and second diodes each having a cathode and an anode, the cathodes of said first and second diodes are operatively connected to the output of said inverter, and the anodes of said first and second diodes are operatively connected to the base and collector of said phase splitting transistor, respectively.

10. An output buffer circuit according to claim 8, wherein said detector circuit includes:
  a phase splitting transistor having a collector, a base coupled to receive the input signal and an emitter; and
  first and second output stage transistors connected in series and each having a collector, emitter and base, the collector of said phase splitting transistor and the collector of said first output stage transistor are operatively connected to the power source voltage terminal, the emitter of said phase splitting transistor is operatively connected to the base of said second output stage transistor, the collector of said phase splitting transistor is operatively connected to the collector of said second output stage transistor, and the emitter of said second output stage transistor is operatively connected to a ground terminal.

11. An output bufffer circuit according to claim 9, wherein said detector circuit comprises:
  a Zener diode having a cathode and an anode;
  a first resistor operatively connected to the power source voltage terminal;
  a second resistor operatively connected to the ground terminal; and
  a detector transistor having a base, collector and emitter, the cathode of said Zener diode is operatively connected to said first resistor and the anode thereof is operatively connected to the base of said detector transistor and to said second resistor, the collector of said detector transistor is operatively connected to the collector of said phase splitting transistor, and the emitter of said detector transistor is operatively connected to the ground terminal.

12. An output buffer circuit having a voltage source terminal and a ground terminal, and operatively connectable to receive an input signal and a control signal, comprising:

input means, operatively connected to the voltage source terminal and operatively connectable to receive the input signal, for passing therethrough the input signal;

control means, operatively connectable to receive the control signal, for generating a first impedance control signal in dependence upon the control signal;

detection means, operatively connected to the voltage source terminal and the ground terminal, for generating a second impedance control signal in dependence upon a rise in the voltage of said voltage source terminal; and output means, operatively connected to said input means, said control means and said detection means, for generating an output signal having a first or second level, or a high impedance in dependence upon the input signal, the first impedance control signal and the second impedance control signal.

13. An output buffer circuit according to claim 12, wherein said detection means comprises:

a first resistor operatively connected to the voltage source terminal;

a second resistor operatively connected to the ground terminal; and a first detection transistor operatively connected to said first resistor, said second resistor and said output means.

14. An output buffer circuit according to claim 13, wherein said detection means further comprises a detection diode operatively connected between said first resistor and said first detection transistor.

15. An output buffer circuit according to claim 13, wherein said detection means further comprises:

a second detection transistor operatively connected to said second resistor, said input means and said output means, and a third detection transistor operatively connected between said first resistor and said first detection transistor.

16. An output buffer circuit according to claim 12, wherein said detection means comprises:

first and second resistors operatively connected to the voltage source terminal;

third and fourth resistors operatively connected to the ground terminal;

a detection diode operatively connected to said third resistor;

an amplifying transistor operatively connected to said detection diode and said first, second and fourth resistors; and a first detection transistor operatively connected to said amplifying transistor, said fourth resistor and said output means.

17. An output buffer circuit according to claim 12, 13, 14, 15 or 16, wherein said input means comprises:

an input transistor operatively connectable to receive the input signal and operatively connected to said control means and said output means; and a resistor operatively connected to said input transistor and the voltage source terminal.

18. An output buffer circuit according to claim 17, wherein said control circuit comprises:

an inverter operatively connectable to receive the control signal;

a first control diode operatively connected between said inverter and said input transistor; and a second control diode operatively connected to said output means, said inverter and said first detection transistor.

19. An output buffer circuit according to claim 18, wherein said output means comprises:

a phase splitting transistor operatively connected to said input transistor, said first detection transistor and said second control diode; and first and second output stage transistors operatively connected to said phase splitting transistor.

* * * * *

UNITED STATES PATENT AND TRADEMARK OFFICE
CERTIFICATE OF CORRECTION

PATENT NO. : 4,498,022

DATED : Feb. 5, 1985

INVENTOR(S) : Kazumi Koyama et al

It is certified that error appears in the above-identified patent and that said Letters Patent is hereby corrected as shown below:

Column 1, line 58, "into" should be --in--; "to" should be --into--.

Signed and Sealed this

Seventeenth Day of September 1985

[SEAL]

Attest:

DONALD J. QUIGG

Attesting Officer

Commissioner of Patents and
Trademarks—Designate